United States Patent [19]

Liu et al.

[11] 4,249,967
[45] Feb. 10, 1981

[54] METHOD OF MANUFACTURING A LIGHT-EMITTING DIODE BY LIQUID PHASE EPITAXY

[75] Inventors: Yet-Zen Liu, Roanoke, Va.; Shang-Yi Chiang, Richardson, Tex.

[73] Assignee: International Telephone and Telegraph Corporation, New York, N.Y.

[21] Appl. No.: 106,632

[22] Filed: Dec. 26, 1979

Related U.S. Application Data

[62] Division of Ser. No. 954,703, Oct. 25, 1978.

[51] Int. Cl.³ .......................................... H01L 21/208
[52] U.S. Cl. .................................. 148/171; 29/569 L; 29/580; 148/1.5; 148/172
[58] Field of Search .................. 148/171, 172, 1.5; 357/17; 29/580, 569 L

[56] References Cited

U.S. PATENT DOCUMENTS

| | | | |
|---|---|---|---|
| 3,968,564 | 7/1976 | Springthorpe | 29/580 |
| 3,984,262 | 10/1976 | Burnham et al. | 148/172 |
| 4,033,796 | 7/1977 | Burnham et al. | 148/175 |
| 4,053,914 | 10/1977 | Goodwin | 357/17 |
| 4,099,999 | 7/1978 | Burnham et al. | 148/187 |
| 4,194,933 | 3/1980 | Logan et al. | 148/171 |

Primary Examiner—G. Ozaki
Attorney, Agent, or Firm—John T. O'Halloran; Peter C. Van Der Sluys

[57] ABSTRACT

A small-area light-emitting diode of the surface-emitting type has a double heterojunction semiconductor structure grown on a substrate. A semiconductor blocking layer having a hole formed therein is disposed between the substrate and the layers of the double heterojunction semiconductor structure to confine the transverse current flow for greater efficiency. A metallic contact layer is formed on the surface of the double heterojunction semiconductor structure on the side opposite the substrate and has a registering hole formed therein having a size approximately equal to the size of the hole formed in the semiconductor blocking layer and disposed in registration therewith along an axis perpendicular to the layers. The cap layer of the double heterojunction semiconductor structure may include a hole etched therethrough and in registration with the previously mentioned holes for better light emission. In a further embodiment, the light-emitting layer is restricted in surface area to a region aligned with said holes for even greater light efficiency and current confinement.

4 Claims, 3 Drawing Figures

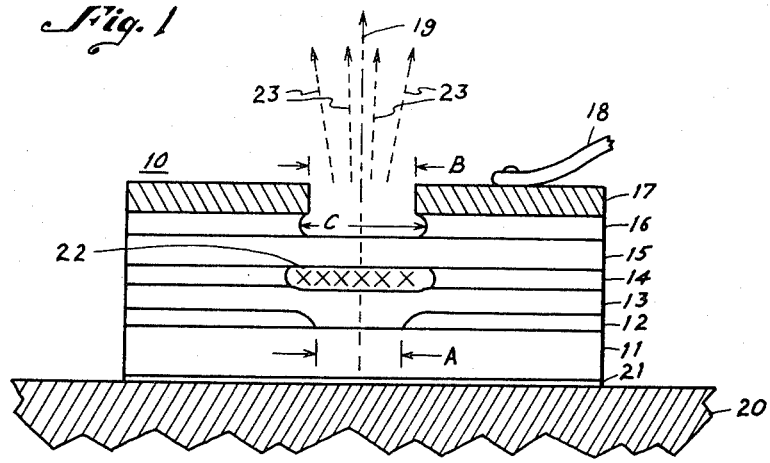
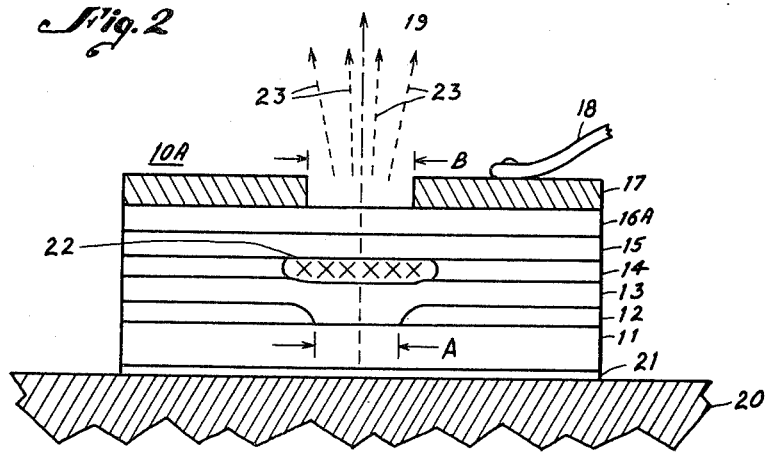
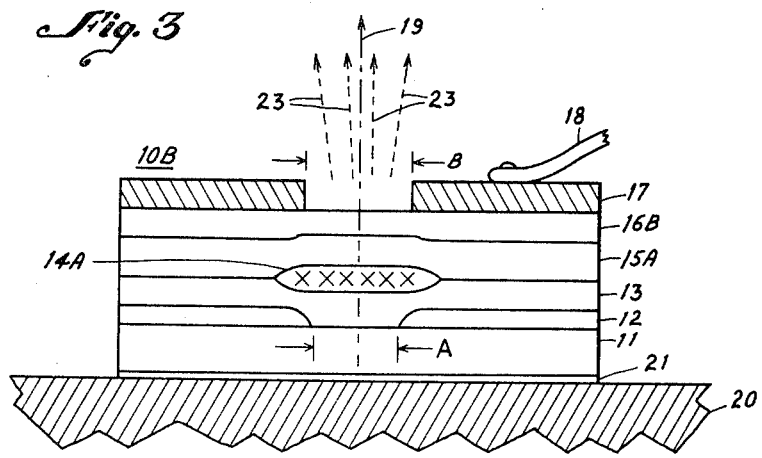

METHOD OF MANUFACTURING A LIGHT-EMITTING DIODE BY LIQUID PHASE EPITAXY

This is a division of application Ser. No. 954,703, filed Oct. 25, 1978.

BACKGROUND OF THE INVENTION

Small-area electroluminescent diodes that can be current-modulated at relatively high current densities and at room temperatures are finding increasing uses as transmitting sources for multimode optical fiber communication lines. Thanks to modern liquid phase epitaxy (LPE) deposition techniques and other techniques now highly developed for manufacture of integrated circuits and diffused-junction planar semiconductor devices, such light-emitting diode structures can now be made small enough for relatively efficient coupling to the end of an optical communication fiber whose active light-transmitting area may have a very small diameter ranging from a few microns up to 100 microns or so.

Numerous forms of light-emitting diodes (LED's) have been developed for such purposes and are described in the published art. For example, one available type of surface-emitting LED incorporates a double heterojunction structure as described in an article appearing in "Optical Fiber Technology" on pages 306–308, copyright 1976 by IEEE Press, and in turn stated to be reprinted with permission from "Optics Communications", Vol. 4, December 1971, pages 307–309. This article, by C. A. Burrus and B. I. Miller of Bell Telephone Laboratories, describes briefly what has been sometimes called in the trade a "Burrus diode". It is with this general class of LED's that our invention is concerned.

SUMMARY OF THE INVENTION

Our invention also relates to a small-area surface-emitting LED incorporating a double heterostructure that is similar in some respects to the above-mentioned "Burrus diode". However, the "Burrus diode" requires extensive etching of a "well" through a relatively thick semiconductor substrate to permit the generated light energy to be emitted in a direction desired by the authors of the above-cited article. In our modified and improved structure, less etching is required and the current distribution is controlled to produce efficient light emission in a direction diametrically opposite to that of the "Burrus diode".

Several modifications of our invention are also described below which permit even greater efficiencies and simplified manufacturing methods. These involve different LPE techniques and choices of layer compositions that are described in detail in the following detailed description.

BRIEF DESCRIPTION OF THE DRAWINGS

FIG. 1 is a vertical cross-section view, partially cut away, of one form of multi-layer surface-emitting LED structure made in accordance with out invention;

FIG. 2 is a similar cross-section view of a modification of the structure of FIG. 1; and FIG. 3 is another similar cross-section view illustrating a further modification of our invention.

In all three figures of the drawings, layer thicknesses and structural dimensions are purely illustrative and not necessarily to scale.

DETAILED DESCRIPTION OF THE INVENTION

The structure of our surface-emitting LED illustrated in FIG. 1 may be fabricated as follows:

(1) The starting material in this illustrative embodiment is a substrate layer 11 of n-type gallium arsenide (n-GaAs).

(2) A relatively thin blocking layer 12 of p-type gallium arsenide (p-GaAs) is first grown on the substrate 11 by liquid phase epitaxy (LPE) techniques well known to the art. A suitable thickness may be in the range of 0.3 to 5.0 microns. The layers 11–12 are then removed from the LPE furnace.

(3) Using known photoresist etching techniques, a small area is etched through layer 12 down to the surface of substrate layer 11. For example, it may be a small round hole of diameter A, as shown in FIG. 1, equal to about 50 microns.

(4) The etched structure is then replaced in the LPE furnace and a double heterostructure is grown on top of it. In a preferred embodiment of FIG. 1, these four layers may have the following compositions and physical characteristics:

(a) Layer 13 is of n-type gallium aluminum arsenide, for example of the formula $n-Ga_{1-x}Al_xAs$, where $x \approx 0.3$. Such a layer has low absorption at desired wavelengths of light to be emitted, e.g., in the range of about 0.75 to 0.90 microns.

(b) Layer 14 is the active emitting layer of p-type semiconductor materials containing gallium and arsenic, e.g., p-type gallium arsenide (p-GaAs) or p-type gallium aluminum arsenide of the formula $p-Ga_{1-y}Al_yAs$, where $y \approx 0.05$ to 0.10.

(c) Layer 15 is similar to layer 13 but of the opposite semiconductor type, e.g., p-type gallium aluminum arsenide of the formula $p-Ga_{1-x}Al_xAs$, where $x \approx 0.3$. As noted under (4) (a) above, such a layer has low absorption at the desired wavelengths of light to be emitted. The band gap of the layers 13 and 15 is effectively larger than that of the intermediate active layer 14. Hence, in the illustrated structure of FIG. 1, layer 15 is essentially transparent at the desired wavelengths.

(d) Layer 16 is the cap layer of the heterostructure. In FIG. 1 it is of p-type gallium arsenide (p-GaAs). This completes the semiconductor layer structure and junctions prepared by LPE techniques in the embodiment of FIG. 1.

(5) The next step is to apply a metal layer 17 and a connection tab 18 to the top of the semiconductor wafer structure of FIG. 1. Again using conventional photoresist etching techniques, a small area is etched through the metal layer 17 directly above the hole A. It may, for example, be another small round hole of diameter B centered on the perpendicular axis 19 through the center of hole A. It is also preferably equal in size, or slightly larger, as compared to hole A.

(6) Next, in the fabrication of the LED of FIG. 1, preferential etching is used to etch further down from the hole in layer 17 through the p-GaAs layer 16, just stopping at the surface of layer 15. This will inherently undercut layer 17, resulting in the hole of diameter C, as illustrated, though ideally it should be no larger than B.

(7) In usual production techniques for LED's, a large number of devices 10 are deposited and etched simultaneously on relatively large substrates. These are then cut up into individual chips, each forming an individual LED structure as shown in FIG. 1. These techniques are well-known to the art and do not form part of our invention.

(8) The final steps are to metallize the lower surface of substrate 11 in FIG. 1 and to bond it to a metal header 20 in any suitable manner, as by the solder layer 21. Alternatively, the lower surface can be metallized before metal layer 17 is applied. Header 20 may conventionally serve as a heat sink as well as an electrical terminal for LED 10 and may have any appropriate size and shape; hence it is shown only in fragmentary cross-section in FIG. 1.

Turning next to the operation of the LED 10 of FIG. 1, assume that an appropriate unidirectional potential or dc voltage pulse is impressed between terminals 18 and 20. A novel feature of our invention is the current confinement provided by the blocking layer 12 so that current flow is concentrated through the hole A and the regions immediately above hole A. The active light-emitting recombination area in layer 14 is therefore as indicated schematically by the cross-hatched area 22 above hole A. This concentration of current flow permits the hole areas B and C to be formed without drastically affecting current flow through area 22 and the cap layer 16, and these in turn permit the light beam, represented by the dashed arrows 23 in FIG. 1, to be taken out through the top of the LED structure as shown. As previously mentioned, this direction of the beam is diametrically opposite to that of the so-called "Burrus diode" described in the referenced article by Messrs. Burrus and Miller, and it also eliminates the need for the deep etched well through the substrate, as described in that article.

Our improved structure therefore provides increased efficiency and lower current for a given light output, contributing to longer life.

The modified device 10A shown in FIG. 2 may, with one exception, be identical to that of FIG. 1 and fabricated by the same method steps. Corresponding elements and dimensions are identified by the same reference indicia. The exception is the semiconductor layer 16A which now forms the cap layer of the heterostructure and does not have a hole etched through it. In this embodiment it is grown as a p-type gallium aluminum arsenide layer having the formula p-$Ga_{1-y}Al_yAs$ where $y \simeq 0.10$ to $0.15$. Such a layer has low absorption and is essentially transparent to the range of wavelength of the emitted light; hence need not be removed for light efficiency.

FIG. 3 shows another modified structure 10B that is similar to those of FIGS. 1 and 2, again with one major difference. As shown, the layer structure is very similar to that shown in FIG. 2 except that the active light-emitting layer is essentially limited to the disc-shaped structure 14A which has again been cross-hatched to indicate schematically that it is almost entirely light-emitting. The formulation of this thin, flattened spheroid 14A requires careful control in the LPE furnace so that the desired material is deposited in the slight depression in layer 13 that resulted from its growth over the hole area A in the blocking layer 12. The objective is to limit the growth of layer 14A to little more than the area immediately above hole area A, as shown in FIG. 3.

The remaining superstructure above the layer 14A is functionally the same as shown in FIG. 2, with layers 15A and 16B corresponding to layers 15 and 16A in FIG. 2 except for a possible slight variation in thickness above the area 14A. Alternatively, layer 16B may be of the same composition as cap layer 16 in FIG. 1 (i.e., of p-GaAs) with the hole C etched through it.

As one further general modification applicable to all of the illustrated structures 10, 10A and 10B, the semiconductor materials may all be doped, by known techniques, so that all of those layers described above as being of the n-types are of the p-types, and vice versa. The compositions of the layers 16A and 16B may also be varied, within limits, so that they can function as filters to produce a narrow spectrum output of light emitted through hole B.

Other structural modifications and alternative manufacturing techniques will also occur to those skilled in the art who read our foregoing disclosure. We therefore intend that such be included to the extent that they are within the spirit and scope of our invention as set forth in the appended claims.

We claim:

1. A method of making a small-area light-emitting diode structure of the surface-emitting type having a plurality of epitaxial semiconductor layers comprising the steps of:

selecting a substrate layer of n-type or p-type gallium arsenide compound having a surface area extending over the length and breadth of the desired diode structure;

growing in a furnace by liquid phase epitoxy on one surface of said substrate layer a thin blocking layer of doped semiconductor materials including gallium arsenide so as to form a junction of the opposite semiconductor type;

removing said two-layer structure from said furnace and etching a first small-area hole through said blocking layer down to the surface of said substrate layer;

placing said etched two-layer structure in said furnace and sequentially growing over said blocking layer a double heterostructure by liquid phase epitoxy comprising further doped semiconductor materials including gallium arsenide so as to form third, fourth, fifth and sixth layers, said third layer being of the same semiconductor type as said substrate layer and the fourth, fifth and sixth layers being of the opposite type, said fourth layer comprising an active light-emitting layer in the completed diode structure and said sixth layer comprising a cap layer;

removing said six-layer structure from said furnace and depositing a metallic contacting layer on the upper surface of said cap layer;

etching a second small-area hole, having a size approximately equal to the size of the first small-area hole, through said metal surface in alignment with said first hole on an axis perpendicular to the layer surfaces; and bonding the other surface of said substrate layer to a metallic contacting and supporting means.

2. The method of claim 1 including the further step of:

prior to the final bonding step, etching a third hole through said second hole and through said cap layer down to the adjoining surface of said fifth layer.

3. The method of claim 1 wherein:

all said six layers extend substantially across the length and breadth of said diode structure.

4. The method of claim 1 wherein:

all said layers are deposited substantially over the length and breadth of said diode structure excepting said fourth active light-emitting layer, said fourth layer being deposited only over a restricted area lying between said holes and axially aligned therewith.

* * * * *